United States Patent
Nian et al.

(10) Patent No.: US 12,341,055 B2
(45) Date of Patent: Jun. 24, 2025

(54) METHOD OF MANUFACTURING SEMICONDUCTOR DEVICES AND SEMICONDUCTOR DEVICES

(71) Applicant: TAIWAN SEMICONDUCTOR MANUFACTURING COMPANY, LTD., Hsinchu (TW)

(72) Inventors: Jun-Nan Nian, Hsinchu (TW); Yao-Hsiang Liang, Hsinchu (TW); Ming-Ching Chung, Tainan (TW); Hsueh-Han Lu, Tainan (TW); Chun-Ju Wu, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 523 days.

(21) Appl. No.: 17/710,517

(22) Filed: Mar. 31, 2022

(65) Prior Publication Data

US 2023/0207381 A1 Jun. 29, 2023

Related U.S. Application Data

(60) Provisional application No. 63/294,729, filed on Dec. 29, 2021.

(51) Int. Cl.
*H01L 21/762* (2006.01)
*H01L 21/02* (2006.01)

(52) U.S. Cl.
CPC .. *H01L 21/76227* (2013.01); *H01L 21/02274* (2013.01); *H01L 21/02323* (2013.01)

(58) Field of Classification Search
None
See application file for complete search history.

(56) References Cited

U.S. PATENT DOCUMENTS

| | | | |
|---|---|---|---|
| 2005/0269290 A1 | 12/2005 | Nozaki et al. | |
| 2011/0241184 A1* | 10/2011 | Han | H01L 23/5258 257/E29.001 |
| 2017/0221821 A1 | 8/2017 | Hu et al. | |
| 2020/0006063 A1* | 1/2020 | Chen | H01L 21/02373 |
| 2021/0005734 A1 | 1/2021 | Lu et al. | |

FOREIGN PATENT DOCUMENTS

WO 2016/179113 A1 11/2016

* cited by examiner

*Primary Examiner* — Asok K Sarkar
(74) *Attorney, Agent, or Firm* — STUDEBAKER BRACKETT PLLC

(57) ABSTRACT

A semiconductor device includes a first interlayer dielectric (ILD) layer disposed over a substrate, a control layer disposed over the first ILD layer and containing silicon and oxygen, and a resistor wire disposed over the control layer. An oxygen concentration of the control layer is greater than an oxygen concentration of the first ILD layer.

20 Claims, 10 Drawing Sheets

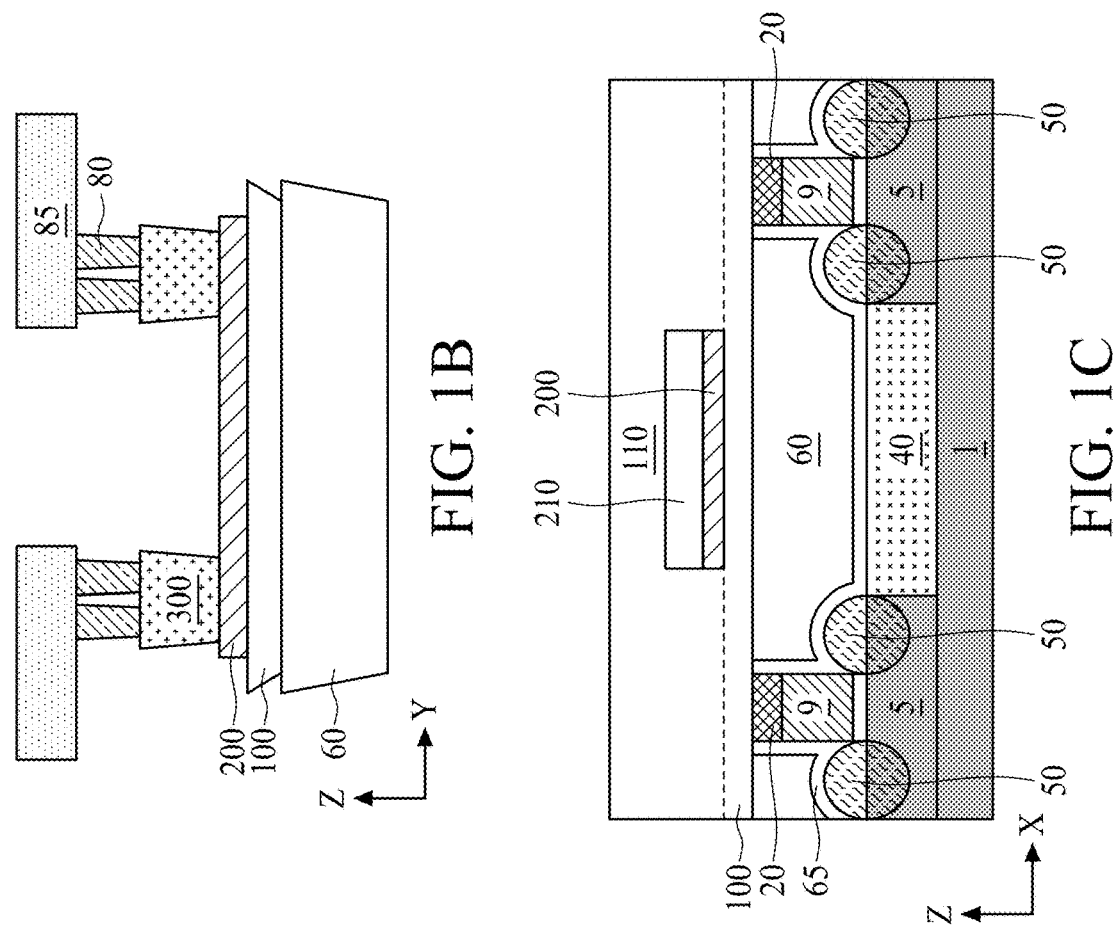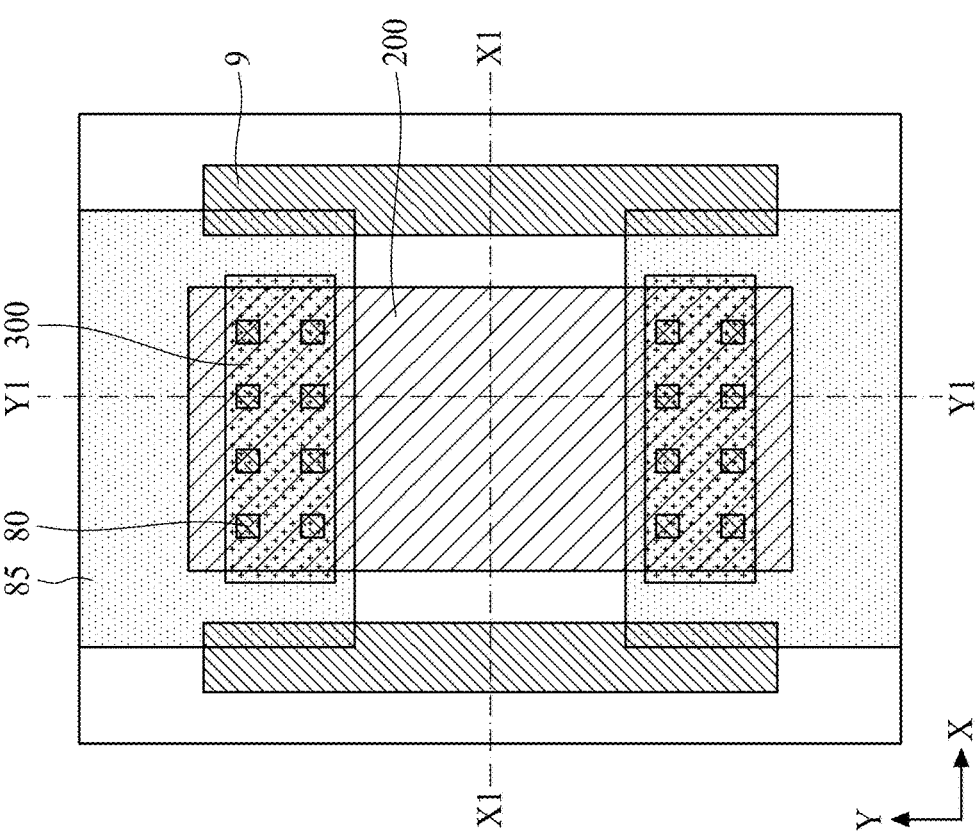

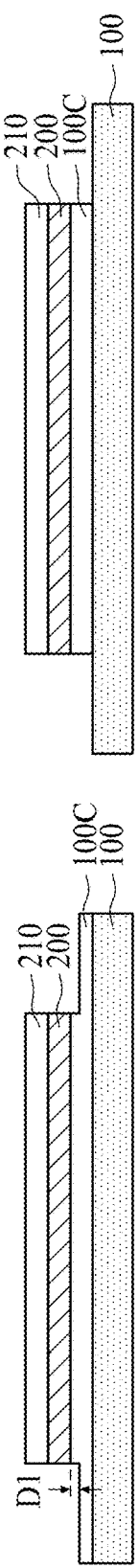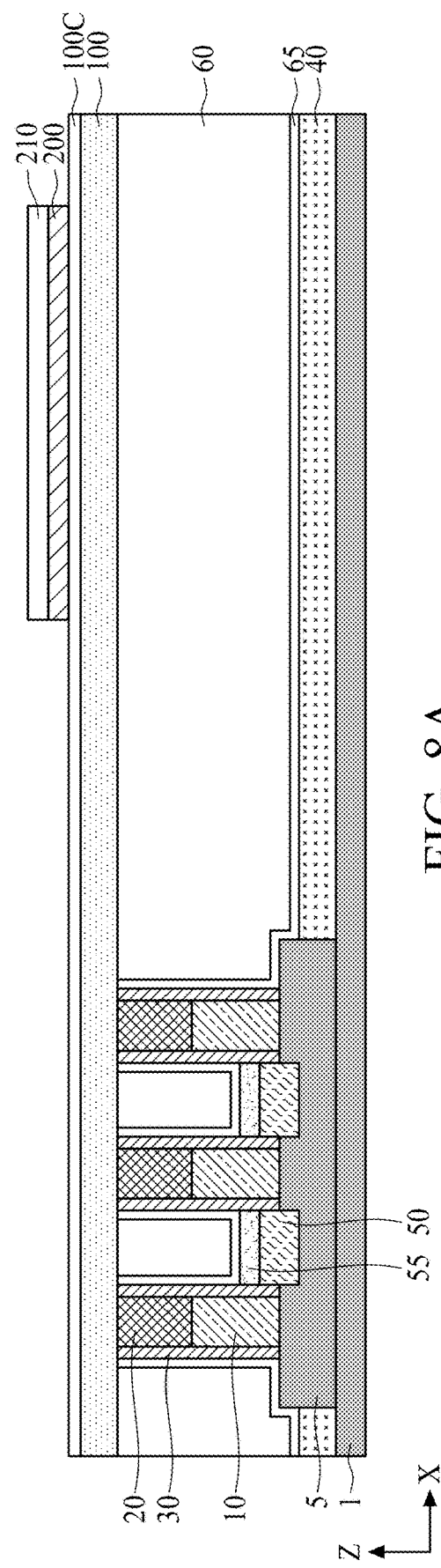

METHOD OF MANUFACTURING SEMICONDUCTOR DEVICES AND SEMICONDUCTOR DEVICES

RELATED APPLICATIONS

This application claims priority to U.S. Provisional Patent Application No. 63/294,729 filed Dec. 29, 2021, the entire contents of which are incorporated herein by reference.

BACKGROUND

In a semiconductor device, such as an integrated circuit (IC) or a large scale integration (LSI), a lot of resistors are used. Some of the resistors are formed by forming diffusion regions in a substrate and some of the resistors are formed by forming conductive layers in upper layers above the underlying structures. As dimensions of semiconductor devices decrease, a more flexible design of resistor wires is required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A shows an exemplary plan view (viewed from the above) illustrating a layout structure of a semiconductor device according to one embodiment of the present disclosure. FIG. 1B shows an exemplary cross sectional view along line Y1-Y1 of FIG. 1A and FIG. 1C shows an exemplary cross sectional view along line X1-X1 of FIG. 1A.

FIGS. 7, 8A, 8B, 8C, 9 and 10 show various stages of a sequential fabrication process of a semiconductor device according to an embodiment of the present disclosure.

DETAILED DESCRIPTION

Figure 2:
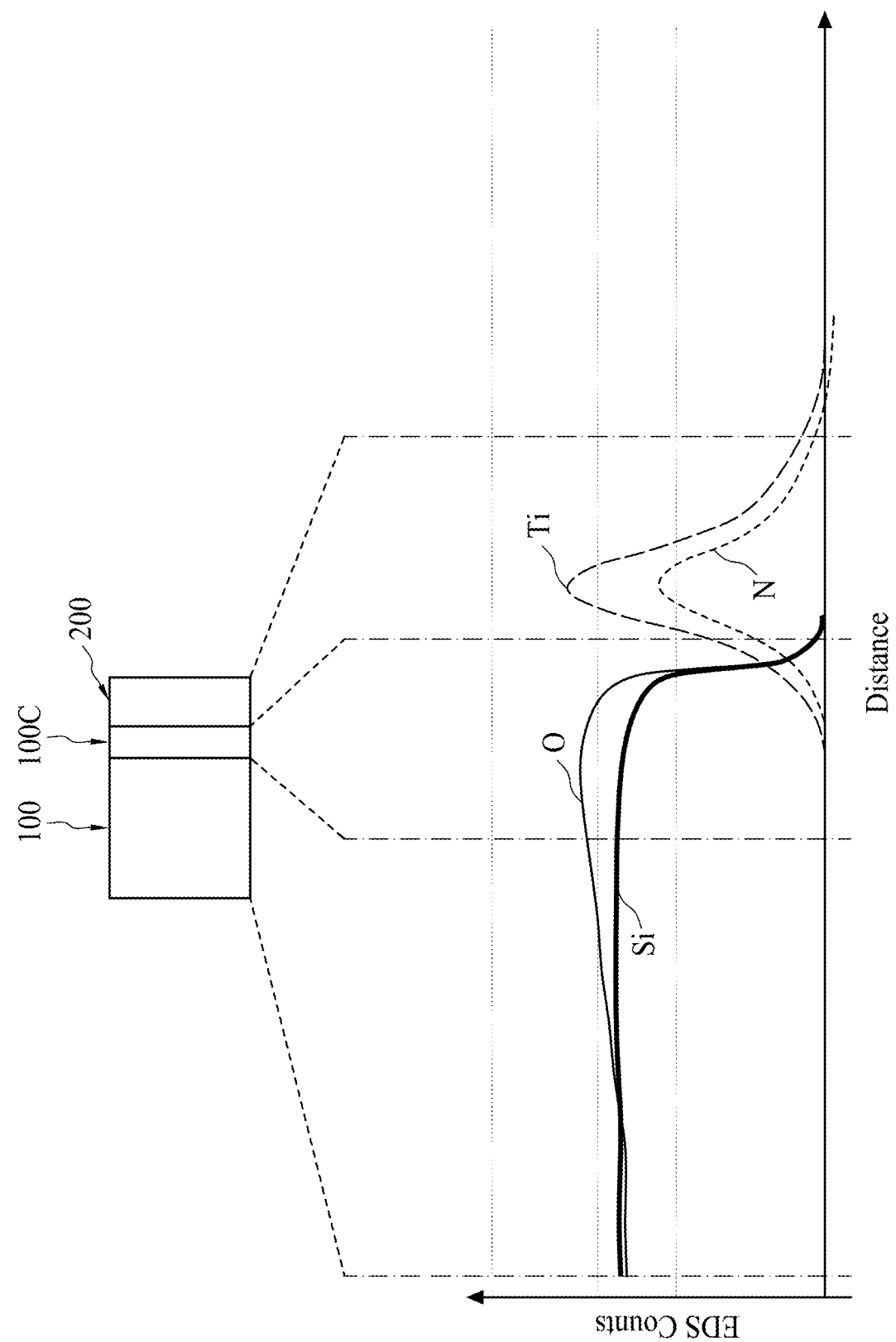
FIG. 2 shows an elemental profile of a resistor wire and adjacent layers according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained. Materials, configurations, structures, operations and/or dimensions explained with one embodiment can be applied to other embodiments, and detained description thereof may be omitted.

FIG. 1A shows an exemplary plan view (viewed from the above) illustrating a layout structure of a semiconductor device according to one embodiment of the present disclosure. FIG. 1B shows an exemplary cross sectional view along line Y1-Y1 of FIG. 1A and FIG. 1C shows an exemplary cross sectional view along line X1-X1 of FIG. 1A.

In FIGS. 1A-1C, a resistor wire 200 extending in the Y direction is provided. The resistor wire 200 is made of a conductive material, such as a metal nitride. Since the resistor wire 200 is a resistor, the conductivity of the resistor wire 200 is relatively low compared with other wires for transferring signals. The resistivity (sheet resistance) of the resistor wire 200 is in a range from about 1 $\Omega/\square$ to about 1000 $\Omega/\square$, in some embodiments, and is in a range from about 10 $\Omega/\square$ to about 200 $\Omega/\square$ in other embodiments. The material for the resistor wire 200 includes, for example, a transition metal nitride (e.g., TiN, TaN), a titanium oxide, a tantalum oxide or TiSiN or any combination thereof.

The size and thickness of the resistor wire 200 may vary depending on the purposes or applications of the resistor wire 200. Accordingly, it is desirable to provide resistors with various resistance values in a semiconductor device.

As shown in FIG. 1A, contacts (or vias) 300 are provided for the resistor wire 200 to be connected to another circuit element via an upper layer metal wire. In some embodiments, multiple via contacts 80 are provided on the contact 300 and the multiple via contacts 80 are connected to an upper wring pattern 85. In some embodiments, only two contacts are provided on both end portions of the resistor wire 200. In other embodiments, four contacts are provided, in which two contacts are used to provide a current flow therebetween and the remaining two contacts are used to measure a voltage or obtain a voltage drop. In some embodiments, a width (in the X direction) of the resistor wire 200 is greater than a length (in the Y direction) of the resistor wire 200. In some embodiments, the length is about twice to about 20 times the width.

As shown in FIGS. 1A and 1C, in the underlying layer below the resistor wire 200, one or more device patterns are formed. In some embodiments, the device patterns include a transistor, a capacitor, or any other electronic device (active devices). In other embodiments, the device patterns include a dummy pattern that does not function as an electronic circuit. In some embodiments, the resistor wire 200 does not overlap any circuit pattern and in other embodiments, the resistor wire 200 partially or fully overlaps one or more circuit or dummy patterns, in plan view.

In some embodiments, the device pattern including a fin structure 5, gate electrodes 9 and source/drain (S/D) structures 50, which are part of an active device or a dummy pattern, is disposed over a substrate 1. As shown in FIG. 1A, the resistor wire 200 partially overlaps the device pattern 85 in plan view. In some embodiments, the resistor wire 200 is electrically connected to an active transistor formed by the fin structure 5, the gate electrode 9 and the S/D structure 50. Each of the gate electrodes 9 may include a gate dielectric layer and a gate electrode layer. In the present disclosure, a dummy "element" means that the "element" has no electrical function or is not part of a functioning circuit, and "a plan view" means a view along the normal line (the Z direction) to the substrate from above.

In one embodiment, plural gate electrodes 9 are disposed over a part of the fin structure 5. The plural gate electrodes 9 extend in the Y direction and the fin structure 5 extends in the X direction. The number of the fin structures per resistor wire is not limited two, and the number may be one or three or more. In some embodiments, a cap insulating layer 20 is disposed over the gate electrode 9.

In one embodiment, plural gate electrodes 9 (and thus plural gate electrode layers) are disposed over one fin structure 5. However, the number of the gate electrodes may be as small as one per fin structure and more than three per fin structure.

As shown in FIG. 1C the fin structure 5 is disposed over a substrate 1, the gate electrodes 9 are disposed over a part of the fin structure 5, and an isolation insulating layer 40 (e.g., shallow trench isolation (STI)) is also disposed over the substrate 1. The fin structure 5 is partially embedded in the isolation insulating layer 40. Further, a first interlayer dielectric (ILD) layer 60 is formed over the fin structure 5, the gate electrode 9 and the source/drain structure 50. In some embodiments, an etch-stop layer 65 is formed before the first ILD layer 60 is formed.

In some embodiments, a second ILD layer 100 is further disposed over the first ILD layer 60, and a third ILD layer 110 is formed over the second ILD layer, as shown in FIGS. 1B and 1C. The resistor wire 200 is embedded in the combination of the second ILD layer 100 and the third ILD layer 110. The contact 300 is formed in the third ILD layer 110. One or more additional ILD layers are formed over the third ILD layer 110 in some embodiments. In some embodiments, a hard mask layer 210 is disposed over the resistor wire 200.

In the present embodiments, the second ILD layer 100 includes a control layer 100C that in contact with the resistor wire 200 to control properties of the resistor wire, as shown in FIG. 2. In some embodiments, the second ILD layer 100 and the control layer are made of silicon oxide. In some embodiments, the control layer 100C is an oxygen rich layer having a higher oxygen concentration (atomic percentage) than the remaining second ILD layer 100. In some embodiments, the control layer is $SiO_x$ and the second ILD layer is $SiO_y$, where $x > y \geq 1$. In some embodiments, y equal to 2. In some embodiments, the second ILD layer 100 is not silicon nitride.

In some embodiments, the oxygen rich layer is an oxygen rich silicon oxide layer, which shows a higher O signal than a Si signal in an EDS or EDX (Energy-dispersive X-ray Spectroscopy). In some embodiments, the signal ratio (O/Si) is more than 1 and less than about 1.5, while the signal ratio (O/Si) of a $SiO_2$ layer is less than 1. In other embodiments, the signal ratio is in a range from about 1.1 to about 1.3. When the oxygen concentration is too large, it may degrade the physical strength of the control layer 100C, and when the oxygen concentration is too small (close to one), the function of the control layer to optimize the crystallinity of the resistor wire 200 may not be obtained. In some embodiments, the oxygen concentration in the control layer 100C gradually changes. In some embodiments, the second ILD layer 100 is free from nitrogen. In some embodiments, the control layer 100C is also free from nitrogen. In some embodiments, both the second ILD layer 100 and the control layer 100 are made of silicon oxide having different oxygen concentration.

In some embodiments, the thickness of the control layer 100C is in a range from about 1 nm to about 50 nm and is in a range from about 2 nm to about 20 nm in other embodiments. When the thickness of the control layer 100C is too small, the function of the control layer to optimize the crystallinity of the resistor wire 200 may not be obtained, and when the thickness of the control layer 100C is too large, it may degrade the physical strength of the second ILD layer 100. In some embodiments, the thickness of the second ILD layer 100 is in a range from about 2 nm to about 200 nm. In some embodiments, the entire second ILD layer 100 is the control layer 100C. In some embodiments, the control layer 100C further contains carbon. In some embodiments, the control layer 110C is $SiO_xC_z$ and the second ILD layer is $SiO_yC_w$, where $x > y$ and $z > w \geq 0$. In some embodiments, w is equal to zero. In some embodiments, x=y=zero. In some embodiments, the control layer 100C shows a higher carbon concentration than the remaining second ILD layer 100. In the EDX profile, the peak of the carbon signal is located within the control layer 100C in some embodiments. In some embodiments, the second ILD layer 100 is free from carbon and/or nitrogen.

In some embodiments, the second ILD layer 100 and the control layer 100C are formed by chemical vapor deposition (CVD) including plasma-enhanced CVD (PECVD) or atomic layer deposition (ALD) or any other suitable film formation method. In some embodiments, by adjusting one or more parameters of the PECVD, the oxygen concentration of the control layer 100C is controlled. In other embodiments, after the second ILD layer 100 made of silicon oxide is formed, oxygen (and/or carbon) atoms/ions are introduced into the surface region of the second ILD layer 100 to form the control layer 100C. In some embodiments, an ion implantation process is employed to introduce oxygen atoms (and/or carbon atoms), and in other embodiments, a plasma process is employed.

By using the control layer 100C below the resistor wire 200, it is possible to control the crystalline structure of the resistor wire 200. In some embodiments, the resistor wire 200 includes TiN having a (2,0,0) crystal orientation, which exhibits a stable lower sheet resistance in the resistor wire. In contrast, when the signal ratio O/Si is smaller than 1, no or weak (2,0,0) orientation is obtained and the crystallinity of the TiN resistor wire is decreased, which increases the sheet resistance.

Figure 3A:
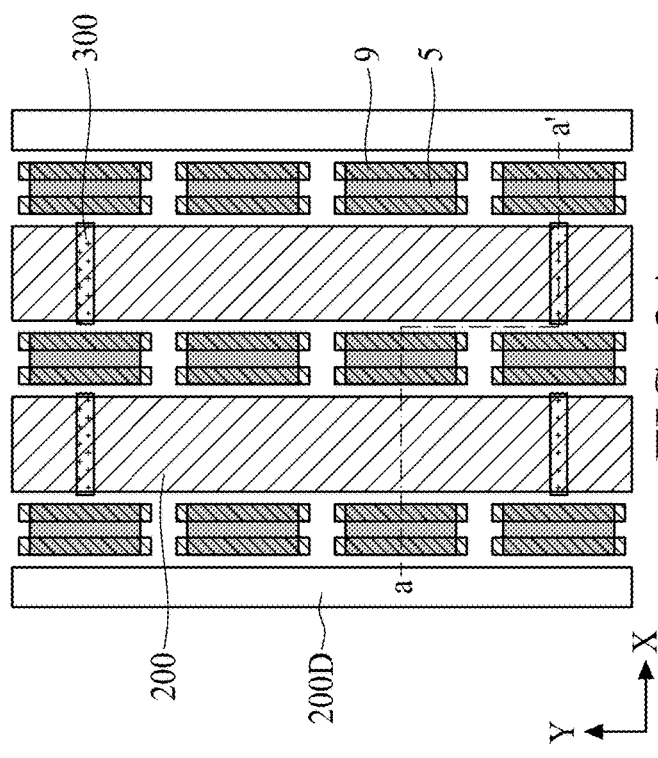
FIG. 3A shows an exemplary plan view illustrating a layout structure of a semiconductor device according to one embodiment of the present disclosure.
Figure 3B:
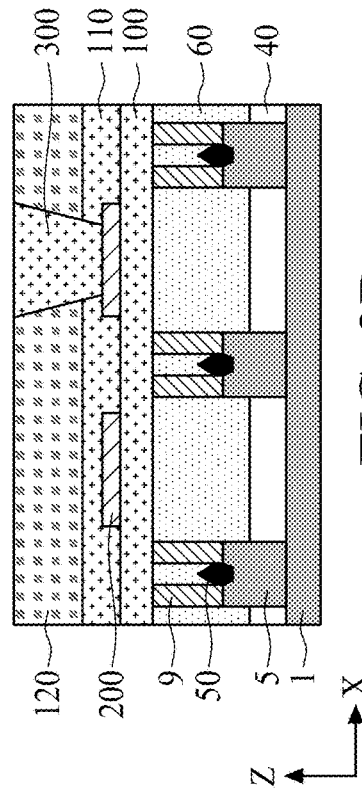
FIG. 3B shows an exemplary cross sectional view along line a-a' of FIG. 3A.

FIG. 3A shows an exemplary plan view illustrating a layout structure of a semiconductor device according to one embodiment of the present disclosure. FIG. 3B shows an exemplary cross sectional view along line a-a' of FIG. 3A.

In some embodiments, the resistor wires 200 are disposed between groups of gate electrodes 9 disposed over a fin structure 5. In some embodiments, one or more dummy wiring patterns 200D are formed adjacent to the resistor wire 200. In some embodiments, the fin, gate and source/drain structures are dummy patterns, and in some embodiments, the fin, gate and source/drain structures are active circuit elements. As shown in FIG. 3A, the resistor wire 200 does not overlap any of the dummy fin structures 5 and the dummy gate electrodes 9 in plan view.

In some embodiments, plural dummy gate electrodes 9 are disposed over a part of the dummy fin structure 5. The plural dummy gate electrodes 9 extend in the Y direction and the dummy fin structure 5 extends in the X direction. As shown in FIG. 3A, plural fin structures 5 are disposed under one resistor wire 200 and are aligned along the Y direction. The number of the dummy fin structures per resistor wire is not limited two, and the number may be one or three or more.

In some embodiments, plural dummy gate electrodes 9 (and thus plural dummy gate electrode layers) are disposed over one dummy fin structure 5, as shown in FIGS. 3A and 3B. However, the number of the dummy gate electrodes may be as small as one per dummy fin structure and more than three per dummy fin structure.

As shown in FIG. 3B, a first ILD layer 60 is formed over the isolation insulating layer 40, and a second ILD layer 100 is further disposed over the first ILD layer 60. One or more additional dielectric layers are formed between the first ILD layer 60 and the second ILD layer 100 in some embodiments. A third ILD layer 110 is further disposed over the second ILD layer 100 and a fourth ILD layer 120 is disposed over the third ILD layer 110 in some embodiments. The resistor wire 200 is embedded in the second and third ILD layers. The contact 300 is formed in the third and fourth ILD layers in some embodiments.

Each of the first, second, third and fourth ILD layers is made of one or more of silicon dioxide ($SiO_2$), SiON, SiCO, SiCN, SiOCN, or any other low-k materials in some embodiments. The ILD layers are formed by CVD, physical vapor deposition (PVD) including sputtering, atomic layer deposition (ALD), or other suitable film formation methods in some embodiments. In some embodiments, immediately adjacent ILD layers are made of different materials.

Figure 4A:
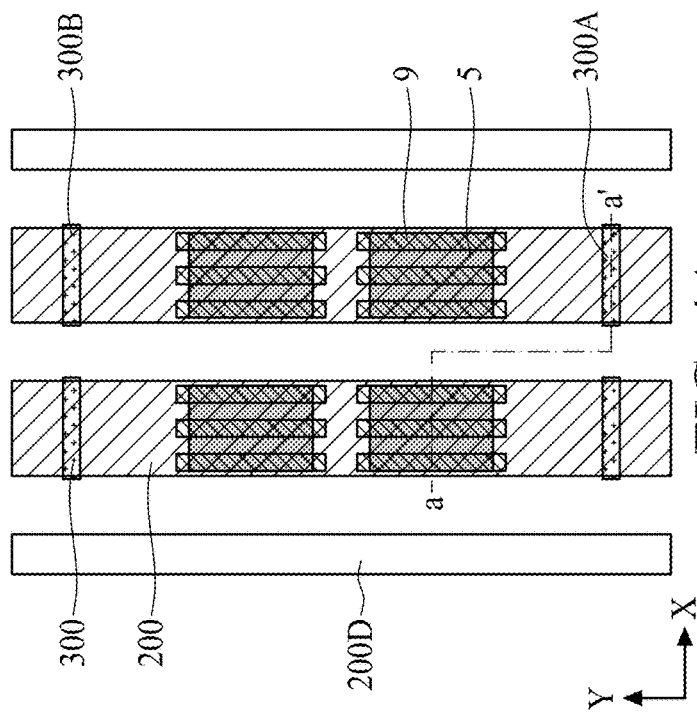
FIG. 4A shows an exemplary plan view illustrating a layout structure of a semiconductor device according to one embodiment of the present disclosure.
Figure 4B:
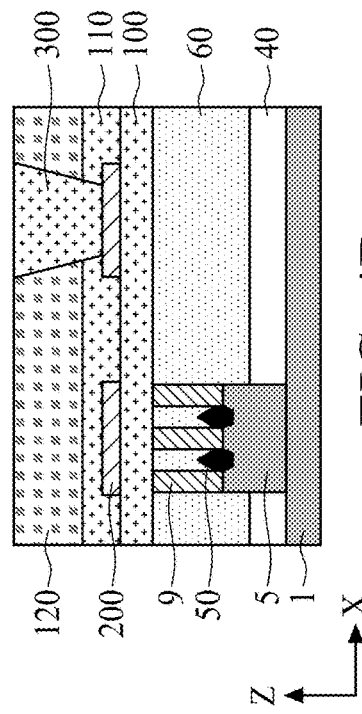
FIG. 4B shows an exemplary cross sectional view along line a-a' of FIG. 4A.

FIG. 4A shows an exemplary plan view illustrating a layout structure of a semiconductor device according to one embodiment of the present disclosure. FIG. 4B shows an exemplary cross sectional view along line a-a' of FIG. 4A.

In FIGS. 4A and 4B, two resistor wires 200 arranged in the X direction are shown. Further, dummy wire patterns 200D are disposed at both sides of the resistor wires 200 along the X direction to improve pattern fidelity in patterning operations, such as lithography and etching. However, the layout of the resistor wire 200 is not limited to these figures. The number of the resistor wires 200 may be as small as one or three or more with (and between) or without two dummy wire patterns.

As shown in FIGS. 4A and 4B, just under the resistor wire 200, a dummy fin structure 5, dummy gate electrodes 9 and dummy source/drain (S/D) structures 50 are disposed over a substrate 1. In some embodiments, the gate electrodes and the source/drain structures are active circuit elements. As shown in FIG. 4A, the resistor wire 200 fully overlaps the dummy fin structure 5 and the dummy gate electrodes 9 in plan view. In other words, the resistor wire 200 is aligned with the dummy fin structure 5 along the Y direction.

In some embodiments, plural dummy gate electrodes 9 are disposed over a part of the dummy fin structure 5. The plural dummy gate electrodes 9 extend in the Y direction and the dummy fin structure 5 extends in the X direction. As shown in FIG. 4A, plural fin structures 5 are disposed under one resistor wire 200 and are aligned along the Y direction. The number of the dummy fin structures per resistor wire is not limited two, and the number may be one or three or more.

In some embodiments, plural dummy gate electrodes 9 (and thus plural dummy gate electrode layers) are disposed over one dummy fin structure 5, as shown in FIGS. 4A and 4B. However, the number of the dummy gate electrodes may be as small as one per dummy fin structure and more than three per dummy fin structure.

As shown in FIG. 4A, the resistor wire 200 overlaps all three dummy gate electrodes in plan view. In some embodiments, the dummy gate electrodes 9 extend in the Y direction and are disposed over two or more dummy fin structures 5. In plan view, the dummy fin structure 5 and the dummy gate electrodes 9 are disposed between a pair of contacts 300, and thus the contacts 300 do not overlap the dummy gate electrodes 9. In other embodiments, however, at least one of the contacts 300 overlaps the dummy gate electrodes 9.

As shown in FIG. 4B, the dummy fin structure 5 is disposed over the substrate 1, the dummy gate electrodes 9 are disposed over a part of the dummy fin structure 5, and an isolation insulating layer 40 is also disposed over the substrate 1. The dummy fin structure 5 is partially embedded in the isolation insulating layer 40. Further, a first interlayer dielectric (ILD) layer 60 is formed over the dummy fin structure 5. The dummy gate electrodes 9 are embedded in the first ILD layer 60. A second ILD layer 100 is further disposed over the first ILD layer 60.

Figure 5A:
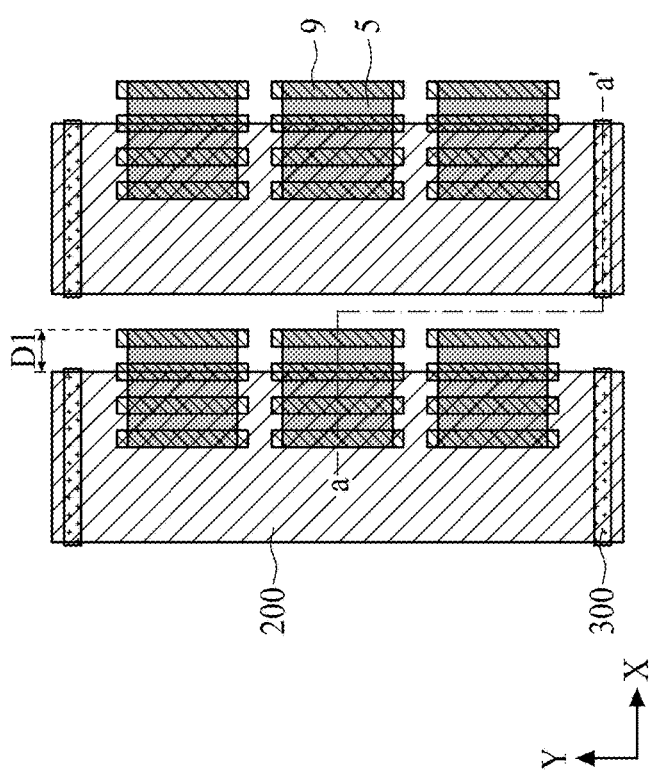
FIG. 5A shows an exemplary plan view illustrating a layout structure of a semiconductor device according to one embodiment of the present disclosure.
Figure 5B:
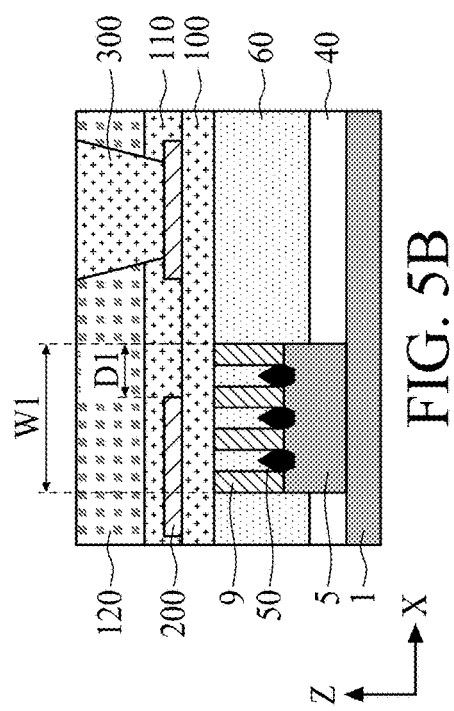
FIG. 5B shows an exemplary cross sectional view along line a-a' of FIG. 5A.

FIG. 5A shows an exemplary plan view illustrating a layout structure of a semiconductor device according to one embodiment of the present disclosure. FIG. 5B shows an exemplary cross sectional view along line a-a' of FIG. 5A.

The layout and the structures of FIGS. 5A and 5B are substantially the same as those of FIGS. 4A and 4B, except for the location of the resistor layer 200 along the X direction and the number of the dummy gate electrodes.

As shown in FIG. 5A, the resistor wire 200 partially overlaps the dummy fin structure 5 in plan view. In other words, the edge (e.g., right edge) of the resistor wire 200 is shifted with respect to the edge (e.g., right edge) of the dummy fin structure 5 in the X direction. Further, the resistor wire 200 overlaps two of the dummy gate electrodes disposed over one dummy fin structure, partially overlaps one of the dummy gate electrodes disposed over the same dummy fin structure and does not overlap one of the dummy gate electrode disposed over the same dummy fin structure.

The "shift" amount D1 is $0 \leq D1 \leq 0.5\ W1$, where W1 is the width of the dummy fin structure 5 in the X direction. When the amount D1 is zero or minus, the resistor wire 200 fully overlaps the dummy fin structure 5 in plan view.

FIGS. 6A-6C, 7, 8, 9 and 10 show various stages of the sequential fabrication process of a semiconductor device according to an embodiment of the present disclosure. It is understood that additional operations can be provided before, during, and after processes shown by FIGS. 6A-10, and some of the operations described below can be replaced or eliminated, for additional embodiments of the method. The order of the operations/processes may be interchangeable. Further, materials, configurations, dimensions and/or processes as explained with respect to the foregoing embodiments may be employed in the following embodiment, and the detailed explanation may be omitted.

Figure 6A:
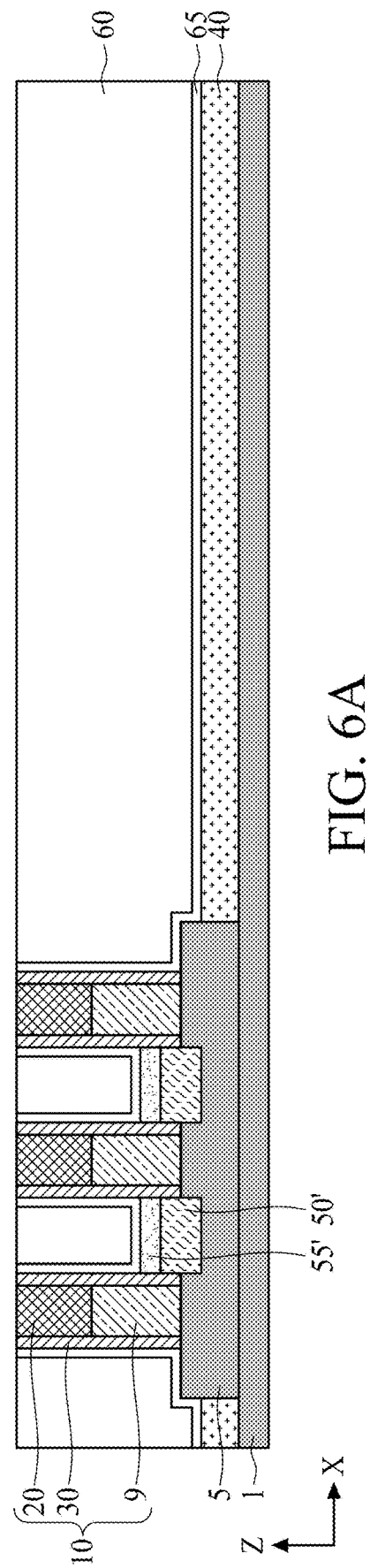
FIGS. 6A, 6B and 6C show one of the various stages of a sequential fabrication process of a semiconductor device according to an embodiment of the present disclosure.

FIG. 6A shows a structure of a semiconductor device after metal gate structures are formed. FIG. 6A shows a circuit area, in which a functioning circuit is disposed, and a resistor area, in which a resistor wire and a dummy fin and gate structure are disposed. In the circuit area of FIG. 6A, metal gate structures 10 are formed over a channel layer, for example, a part of a fin structure 5. The gate structure 10 includes a gate dielectric layer (not shown), a gate electrode 9 and a cap insulating layer 20 disposed over the metal gate electrode 9. In some embodiments, the gate structure further includes gate sidewall spacers 30 provided on sidewalls of the metal gate structure 9 and the cap insulating layer 20.

The fin structure 5 protrudes from the isolation insulating layer 40. The thickness of the metal gate electrode 9 is in a range from 15 nm to 50 nm in some embodiments. The thickness of the cap insulating layer 20 is in a range from about 10 nm to about 30 nm in some embodiments, and is in a range from about 15 nm to about 20 nm in other embodiments. The film thickness of the sidewall spacers 30 at the bottom of the sidewall spacers is in a range from about 3 nm to about 15 nm in some embodiments, and is in a range from about 4 nm to about 10 nm in other embodiments. Further, source/drain (S/D) regions 50 including one or more epitaxial semiconductor layers are formed adjacent to the gate structures, and spaces between the gate structures are filled with a first interlayer dielectric (ILD) layer 60. In addition, a silicide layer 55, such as WSi, CoSi, NiSi or TiSi, is formed on the S/D regions 50 in some embodiments.

In some embodiments, the gate structure 10 is a part of an active circuit, and in other embodiments, the gate structure 10 is a dummy gate structure.

Figure 6C:
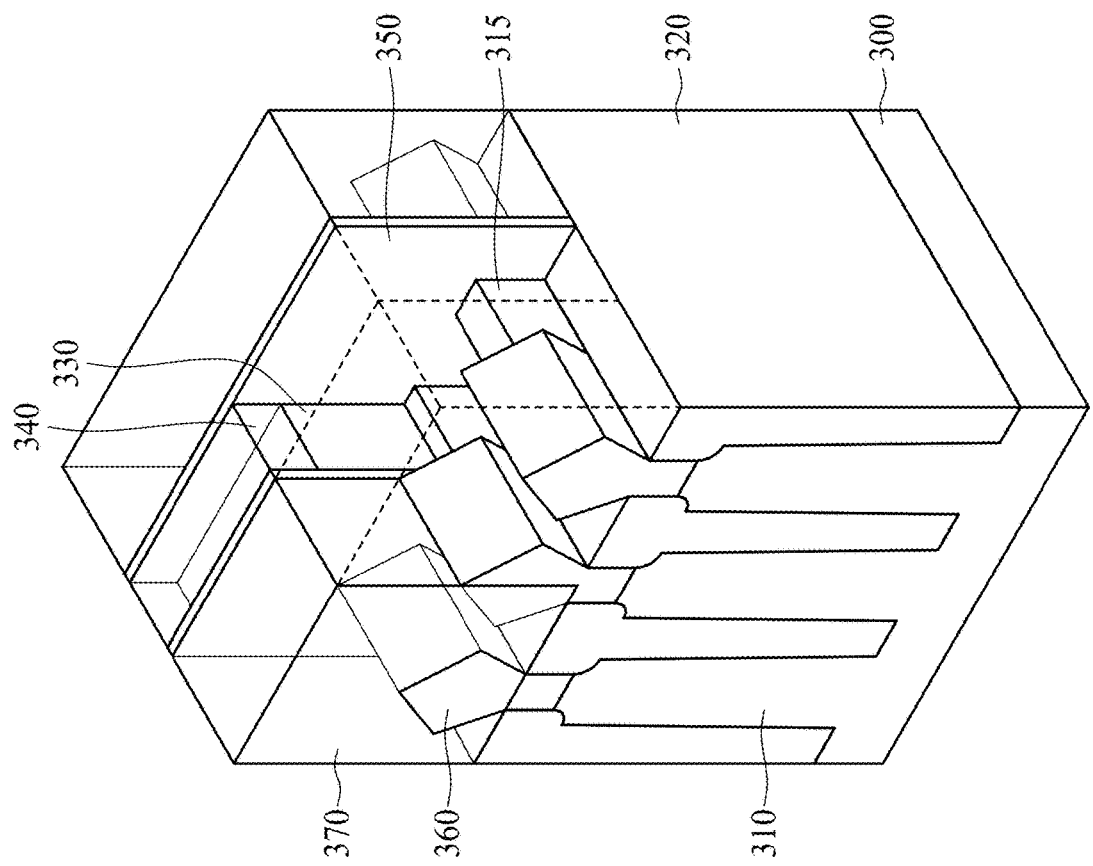
Figure 6B:
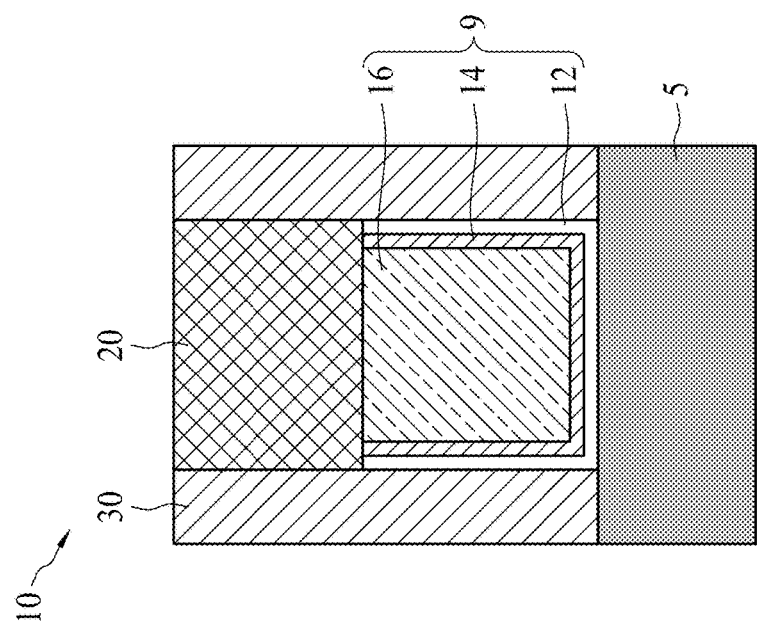

FIG. 6B is an enlarged view of the metal gate structure 10. The metal gate electrode 9 includes one or more layers 16 of metal material, such as Al, Cu, W, Ti, Ta, TiN, TiAl, TiAlC, TiAlN, TaN, NiSi, CoSi, and other conductive materials. A gate dielectric layer 12 disposed between the channel layer and the metal gate includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof.

In some embodiments, one or more work function adjustment layers 14 are interposed between the gate dielectric layer 12 and the metal material 16. The work function adjustment layers 14 are made of a conductive material, such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The cap insulating layer 20 includes one or more layers of insulating material, such as a silicon nitride based material including SiN, SiCN and SiOCN. The sidewall spacer 30 is made of a different material than the cap insulating layer 20 and includes one or more layers of insulating material, such as a silicon nitride based material including SiN, SiON, SiCN and SiOCN. The first ILD layer 60 includes one or more layers of an insulating material, such as a silicon oxide based material, such as silicon dioxide ($SiO_2$), SiON, SiCO or SiOCN, or other low-k materials.

The material of the sidewall spacer 30, the material of the cap insulating layer 20, and a material of the first ILD layer 60 are different from each other, so that each of these layers can be selectively etched. In one embodiment, the sidewall spacer 30 is made of SiOCN, SiCN or SiON, the cap insulating layer 20 is made of SiN, and the first ILD 60 layer is made of $SiO_2$.

In some embodiments, fin field effect transistors (Fin FETs) fabricated by a gate-replacement process are employed.

FIG. 6C shows an exemplary perspective view of a Fin FET structure. First, a fin structure 310 is fabricated over a substrate 300. The fin structure includes a bottom region and an upper region as a channel region 315. The substrate is, for example, a p-type silicon substrate with an impurity concentration in a range from about $1\times10^{15}$ $cm^{-3}$ to about $1\times10^{18}$ $cm^{-3}$. In other embodiments, the substrate is an n-type silicon substrate with an impurity concentration in a range from about $1\times10^{15}$ $cm^{-3}$ to about $1\times10^{18}$ $cm^{-3}$. Alternatively, the substrate may comprise another elementary semiconductor, such as germanium; a compound semiconductor including Group IV-IV compound semiconductors, such as SiC and SiGe, Group III-V compound semiconductors, such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials, such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric layer (ILD) 370 is formed over the dummy gate structure and the source/drain region. After a planarization operation, the dummy gate structure is removed so as to make a gate space. Then, in the gate space, a metal gate structure 330 including a metal gate electrode and a gate dielectric layer, such as a high-k dielectric layer, is formed. Further, the cap insulating layer 340 is formed over the metal gate structure 330, so as to obtain the Fin FET structure shown in FIG. 6C. In FIG. 6C, parts of the metal gate structure 330, the cap insulating layer 340, sidewalls 330 and the ILD 370 are cut to show the underlying structure.

The metal gate structure 330, the cap insulating layer 340, sidewalls 330, source/drain 360 and the ILD 370 of FIG. 6C substantially correspond to the metal gate electrode 9, the cap insulating layers 20, the sidewall spacers 30, S/D regions 50 and first ILD 60, of FIG. 6A.

Figure 7:
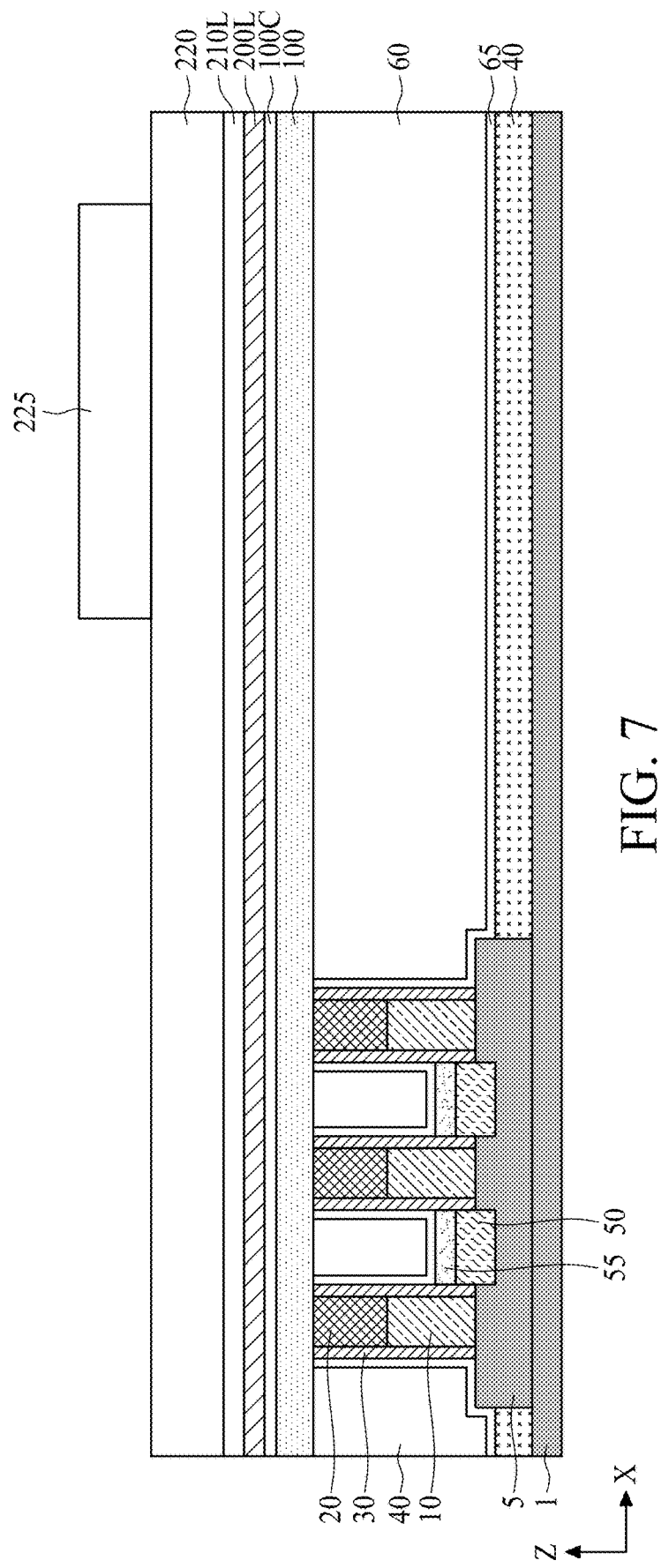

After the first ILD layer 60 is formed, as shown in FIG. 7, a second ILD layer 100 is formed over the first ILD layer 60.

In some embodiments, a control layer 100C shown in FIG. 2 is formed on at least the surface region of the second ILD layer 100. As set forth above, the control layer is formed by adjusting one or more of deposition conditions of the second ILD layer 100, and/or introducing oxygen (and/or carbon) atoms into the surface region of the second ILD layer 100. In some embodiments, the deposition conditions include a flow rate of the source gas (e.g., $O_2$ gas, etc.), a flow ratio of source gases (e.g., a ratio between an oxygen source gas and a silicon source gas), plasma power (e.g., input RF power, etc.), a substrate temperature and etc. In some embodiments, a thickness of the second ILD layer 100 including the control layer is in a range from about 2 nm to about 200 nm, and is in a range from about 10 nm to about 100 nm in other embodiments.

After the control layer is formed, a blanket layer 200L for the resistor wire, a hard mask layer 210L and a bottom antireflective coating (BARC) 220 are sequentially formed over the second ILD layer including the control layer, and a photo resist pattern 225 is formed over the BARC layer 220, as shown in FIG. 7. In some embodiments, the hard mask layer 210L includes one or more layers of a silicon nitride based material, such as SiN, SiON or SiOCN. In some embodiments, a thickness of the hard mask layer 210L is in a range from about 2 nm to about 200 nm, and is in a range from about 10 nm to about 100 nm in other embodiments.

In some embodiments, an additional insulating layer, which functions as a first etch stop layer (ESL) in the subsequent contact hole etching operation, is disposed between the first ILD layer 60 and the second ILD layer 100. The additional insulating layer includes one or more layers of a silicon nitride based material, such as SiN, SiCN or SiOCN.

The blanket layer 200L for the resistor wire is formed by CVD, physical vapor deposition (PVD) including sputtering or other suitable film formation methods. In some embodiments, the blanket layer 200L includes TiN. In other embodiments, the blanket layer 200L includes multiple conductive layers, and in some embodiments, the bottommost layer of the multiple layers is made of TiN. As set forth above, the TiN layer is (2,0,0) oriented. In some embodiments, a thickness of the blanket conductive layer 200L is in a range from about 2 nm to about 200 nm, and is in a range from about 10 nm to about 100 nm in other embodiments.

In some embodiments, the blanket conductive layer 200L is a TiN layer or a TaN layer formed by a sputtering process. In some embodiments, by adjusting an input electric power during the sputtering process, the sheet resistance value of the metallic layer 200L is adjusted. In some embodiments, by increasing the input power by 20%, the sheet resistance decreases by about 10%, and by decreasing the input power by 10%, the sheet resistance increases by about 20%. This is caused by different structures, e.g., crystallinity, of the metallic layer. Accordingly, when a desired sheet resistance value for a resistor wire is given, for example, by a circuit/device designer (device specification), the input power of the sputtering process is adjusted to obtain a desired sheet resistance for the metallic layer 200L. In other embodiments, the blanket layer 200L is formed by PECVD, and the sheet resistance is adjusted by adjusting an input electric power for generating the plasma.

In some embodiments, by combining two or more layers formed by different conditions, the sheet resistance value of the blanker conductive layer 200L is adjusted. In some embodiments, the blanker conductive layer 200L includes bi-layers, and one of the bi-layers (e.g., the upper layer) has a higher sheet resistance than the other layer. Accordingly, by adjusting the thicknesses of each of the bi-layers, different sheet resistance values are obtained.

Then, the BARC layer 220 is patterned by using the photo resist pattern 225, and subsequently the hard mask layer 210L is patterned to form a hard mask pattern 210. Further, the blanket layer 200L is patterned by using the hard mask pattern 210 as an etching mask as shown in FIG. 8A.

In some embodiments, as shown in FIG. 8A, the control layer 100C is not etched. In other embodiments, the control layer 100C not covered by the resistor wire 200 and the hard mask pattern 210 is slightly etched by an amount D1, as shown in FIG. 8B. In some embodiments, D1 is in a range from about 0.5 nm to about 50 nm. In some embodiments, D1 is about 1% to about 20% of the thickness of the second ILD layer. In some embodiment, the control layer 100C not covered by the resistor wire 200 and the hard mask pattern 210 is fully etched as shown in FIG. 8C.

Figure 9:
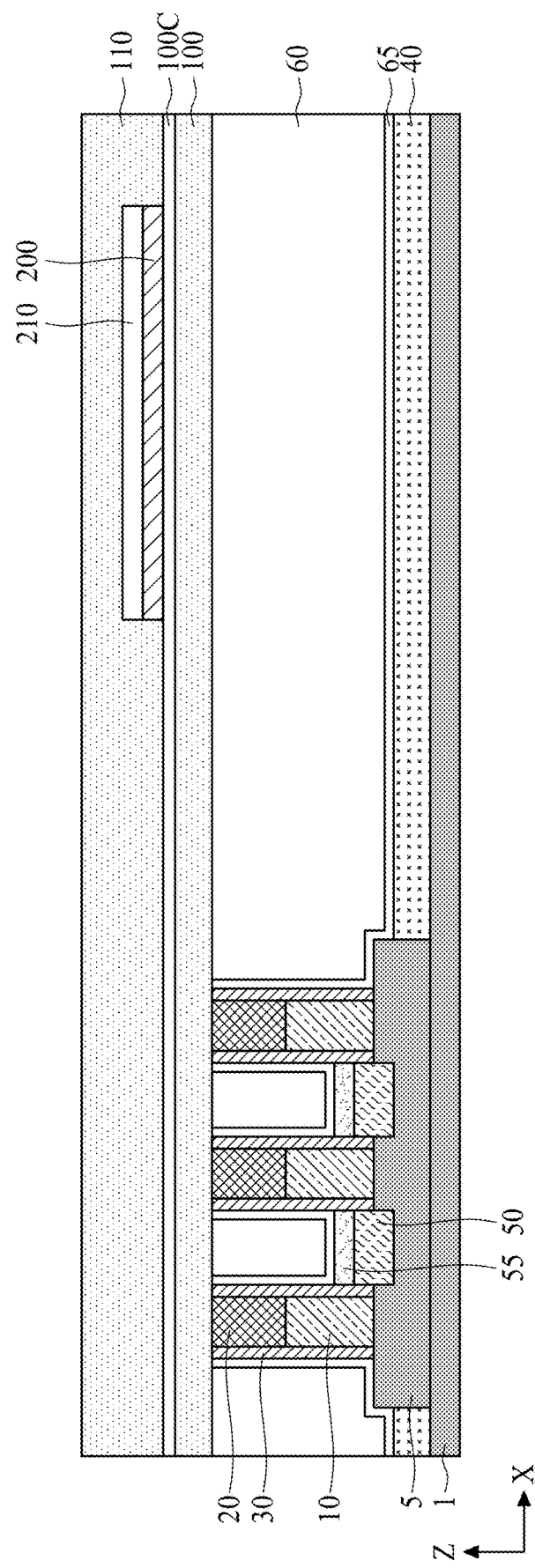

Subsequently, the third ILD layer 110 is formed over the hard mask pattern 210 and the resistor wire 200 and over the second ILD layer 100, as shown in FIG. 9. In some embodiments, before the third ILD layer 110 is formed, the hard mask pattern 210 is removed.

Figure 10:
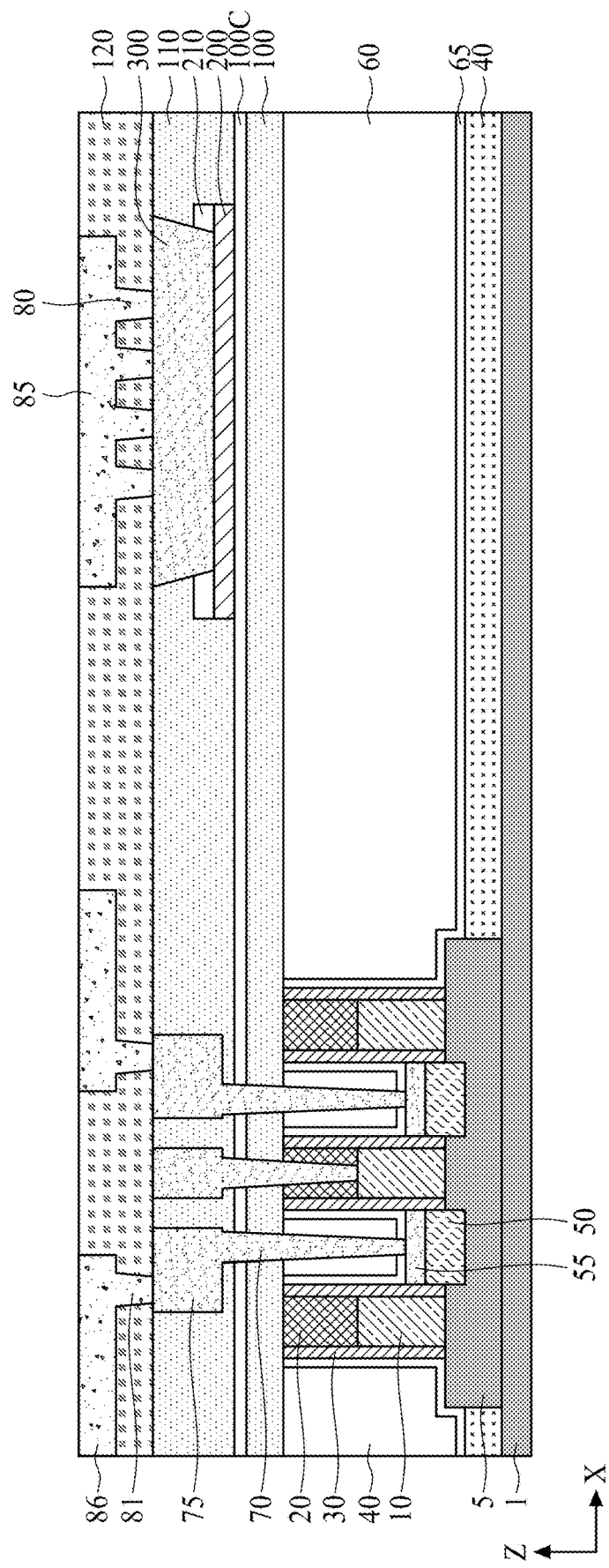

Then, a contact 300 penetrating the third ILD layer 110 and the hard mask pattern 210 and contacting the resistor wire 200 is formed as shown in FIG. 10. In some embodiments, in the circuit area, a first contact plug 70 and a first metal wiring 75 are formed by using, for example, a dual damascene process, as shown in FIG. 10. In some embodiments, the first metal wiring (and the first contact plug 70) and the contact 300 are formed by the same process (at the same process step). In some embodiments, the contact 300, the first contact plug 70 and the first metal wiring 75 include one or more layers of Cu, Al, Ti, Co, W or Ni, or alloys thereof, or TiN or TaN.

Further, as shown in FIG. 10, a fourth ILD layer 120 is formed over the third ILD layer 110. In some embodiments, an additional insulating layer, which functions as a second ESL in the subsequent contact hole etching operation, is disposed between the fourth ILD layer 120 and the third ILD layer 110. After the fourth ILD layer 120 is formed, the via contacts 80 are formed, and the upper wiring pattern 85 is formed to be electrically connected to the resistor wire 200, as shown in FIG. 10. Similarly, a via contact 81 and an upper wiring pattern 86 are formed to be electrically connected to the first metal wiring 75. In some embodiments, a dual or single damascene process is employed to form the via contact and the upper wiring patterns.

It is understood that the devices shown in FIG. 10 undergo further CMOS processes to form various features such as interconnect metal layers, dielectric layers, passivation layers, etc.

The various embodiments or examples described herein offer several advantages over the existing art. For example, in the present disclosure, by inserting an oxygen rich control layer between the second ILD layer and the blanket conductive layer for a resistor wire, it is possible to optimize the crystallinity of the blanket conductive layer, which can improve electrical and/or physical stability of the resistor wire.

It will be understood that not all advantages have been necessarily discussed herein, no particular advantage is required for all embodiments or examples, and other embodiments or examples may offer different advantages.

According to one aspect of the present disclosure, a semiconductor device includes a first interlayer dielectric (ILD) layer disposed over a substrate and contains silicon and oxygen, a control layer disposed over the first ILD layer and containing silicon and oxygen, and a resistor wire disposed over the control layer. An oxygen concentration of the control layer is greater than an oxygen concentration of the first ILD layer. In one or more of the foregoing and following embodiments, a signal ratio of oxygen to silicon of the control layer by an energy-dispersive X-ray spectroscopy (EDX) measurement is greater than 1. In one or more of the foregoing and following embodiments, a signal ratio of oxygen to silicon of the first ILD layer by an EDX measurement is smaller than 1. In one or more of the foregoing and following embodiments, both the first ILD layer and the control layer are free from nitrogen. In one or more of the foregoing and following embodiments, the resistor wire is made of TiN or TaN. In one or more of the foregoing and following embodiments, the resistor wire is made of TiN with (2,0,0) orientation. In one or more of the foregoing and following embodiments, the control layer further contains carbon, and a carbon concentration of the control layer is greater than a carbon concentration of the first ILD layer.

In accordance with another aspect of the present disclosure, a semiconductor device includes a first transistor structure and a second transistor structure disposed over a substrate, a first interlayer dielectric (ILD) layer disposed over the first and second transistor structures, a second ILD layer disposed over the first ILD layer and containing silicon and oxygen, a control layer disposed over the second ILD layer and containing silicon and oxygen, and a resistor wire formed of a conductive material and disposed over the second ILD layer. An oxygen concentration of the control layer is greater than an oxygen concentration of the second ILD layer. In one or more of the foregoing and following embodiments, a signal ratio of oxygen to silicon of the control layer by an energy-dispersive X-ray spectroscopy (EDX) measurement is greater a signal ratio of oxygen to silicon of the second ILD layer by an EDX measurement. In one or more of the foregoing and following embodiments, the resistor wire is made of TiN with (2,0,0) orientation. In one or more of the foregoing and following embodiments, the control layer further contains carbon, and a carbon concentration of the control layer is greater than a carbon concentration of the first ILD layer. In one or more of the foregoing and following embodiments, in plan view, the resistor wire is disposed between the first transistor structure and the second transistor structure. In one or more of the foregoing and following embodiments, in plan view, the resistor wire does not overlap the first transistor structure and the second transistor structure. In one or more of the foregoing and following embodiments, each of the first and second transistor structures include a fin structure extending in a first direction and a gate structure extending in a second direction crossing the first direction, and the resistor wire extends in the second direction. In one or more of the foregoing and following embodiments, in plan view, the resistor wire partially overlap at least one of the first transistor structure or the second transistor structure.

In accordance with another aspect of the present disclosure, a semiconductor device includes a dummy fin structure disposed over a substrate, a dummy gate structure disposed over a part of the dummy fin structure, a first interlayer dielectric (ILD) layer disposed over the dummy gate structure and the dummy fin structure, a second ILD layer disposed over the first ILD layer and containing silicon and oxygen, a control layer disposed over the second ILD layer and containing silicon and oxygen, and a resistor wire formed of a conductive material and disposed over the second ILD layer. An oxygen concentration of the control layer is greater than an oxygen concentration of the second ILD layer. In one or more of the foregoing and following embodiments, the resistor wire overlaps the dummy gate structure in plan view. In one or more of the foregoing and following embodiments, the conductive material of the resistor wire includes a nitride of a transition metal. In one or more of the foregoing and following embodiments, the resistor wire is made of TiN with (2,0,0) orientation. In one or more of the foregoing and following embodiments, the dummy gate structure includes two or more dummy gate electrodes disposed over the dummy fin structure and extending in a first direction and arranged in a second direction perpendicular to the first direction, and the resistor wire extends in the first direction. In one or more of the foregoing and following embodiments, the resistor wire is longer than the dummy gate electrodes along the first direction. In one or more of the foregoing and following embodiments, two four contacts contacting the resistor wire are provided, and the dummy gate structure is disposed between the two contacts in plan view. In one or more of the foregoing and following embodiments, the two contacts do not overlap the dummy gate structure.

In accordance with another aspect of the present disclosure, in a method of manufacturing a semiconductor device, a first fin structure is formed over a substrate, a first gate structure is formed over a part of the first fin structure, a first interlayer dielectric (ILD) layer is formed so that the first gate structure is embedded in the first ILD layer, a second ILD layer is formed over the first ILD layer, a control layer is formed over the second ILD layer, and a resistor wire is formed over the control layer. An oxygen concentration of the control layer is greater than an oxygen concentration of the second ILD layer. In one or more of the foregoing and following embodiments, the control layer is formed by introducing oxygen atoms or ions into a surface of the second ILD layer. In one or more of the foregoing and following embodiments, an ion implantation process is used to introduce oxygen. In one or more of the foregoing and following embodiments, plasma generated from an oxygen containing gas is used to introduce oxygen. In one or more of the foregoing and following embodiments, the control layer is formed by changing one or more deposition parameters of a deposition process of the second ILD layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first interlayer dielectric (ILD) layer disposed over a substrate and containing silicon and oxygen;
a control layer disposed over and in contact with the first ILD layer and containing silicon and oxygen; and
a resistor wire disposed over and in contact with the control layer,
wherein an oxygen concentration of the control layer is greater than an oxygen concentration of the first ILD layer.

2. The semiconductor device of claim 1, wherein:
a signal ratio of oxygen to silicon of the control layer by an energy-dispersive X-ray spectroscopy (EDX) measurement is greater than 1, and
a signal ratio of oxygen to silicon of the first ILD layer by an EDX measurement is smaller than 1.

3. The semiconductor device of claim 1, wherein both the first ILD layer and the control layer are free from nitrogen.

4. The semiconductor device of claim 1, wherein a thickness of the control layer is in a range from 1 nm to 50 nm.

5. The semiconductor device of claim 1, wherein the resistor wire is made of TiN with (2,0,0) orientation.

6. The semiconductor device of claim 1, wherein the control layer further contains carbon, and a carbon concentration of the control layer is greater than a carbon concentration of the first ILD layer.

7. A semiconductor device, comprising:
a first transistor structure and a second transistor structure disposed over a substrate;
a first interlayer dielectric (ILD) layer disposed over the first and second transistor structures;
a second ILD layer disposed over the first ILD layer and containing silicon and oxygen;
a control layer disposed over and in contact with the second ILD layer and containing silicon and oxygen; and
a resistor wire formed of a conductive material and disposed over and in contact with the second ILD layer;
wherein an oxygen concentration of the control layer is greater than an oxygen concentration of the second ILD layer.

8. The semiconductor device of claim 7, wherein a signal ratio of oxygen to silicon of the control layer by an energy-dispersive X-ray spectroscopy (EDX) measurement is greater a signal ratio of oxygen to silicon of the second ILD layer by an EDX measurement.

9. The semiconductor device of claim 7, wherein the resistor wire is made of TiN with (2,0,0) orientation.

10. The semiconductor device of claim 7, wherein the control layer further contains carbon, and a carbon concentration of the control layer is greater than a carbon concentration of the first ILD layer.

11. The semiconductor device of claim 7, wherein in plan view, the resistor wire is disposed between the first transistor structure and the second transistor structure.

12. The semiconductor device of claim 11, wherein in plan view, the resistor wire does not overlap the first transistor structure and the second transistor structure.

13. The semiconductor device of claim 11, wherein each of the first and second transistor structures include a fin structure extending in a first direction and a gate structure extending in a second direction crossing the first direction, and the resistor wire extends in the second direction.

14. The semiconductor device of claim 7, wherein in plan view, the resistor wire partially overlaps at least one of the first transistor structure or the second transistor structure.

15. A method of manufacturing a semiconductor device, the method comprising:
forming a first fin structure over a substrate;
forming a first gate structure over a part of the first fin structure;
forming a first interlayer dielectric (ILD) layer so that the first gate structure is embedded in the first ILD layer;
forming a second ILD layer over the first ILD layer;
forming a control layer over and in contact with the second ILD layer; and
forming a resistor wire over and in contact with the control layer:
wherein an oxygen concentration of the control layer is greater than an oxygen concentration of the second ILD layer.

16. The method of claim 15, wherein the control layer is formed by introducing oxygen atoms or ions into a surface of the second ILD layer.

17. The method of claim 16, wherein an ion implantation process is used to introduce the oxygen.

18. The method of claim 16, wherein plasma generated from an oxygen containing gas is used to introduce the oxygen.

19. The method of claim 15, wherein the control layer is formed by changing one or more deposition parameters of a deposition process of the second ILD layer.

20. The method of claim 15, wherein the resistor wire is made of TiN with (2,0,0) orientation.

* * * * *